(12) United States Patent
Uchiyama et al.

(10) Patent No.: US 9,933,615 B2
(45) Date of Patent: Apr. 3, 2018

(54) ELECTRO-OPTIC DEVICE, ELETRO-OPTIC UNIT, AND ELECTRONIC APPARATUS

(71) Applicant: SEIKO EPSON CORPORATION, Tokyo (JP)

(72) Inventors: Suguru Uchiyama, Suwa (JP); Kosuke Takahashi, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/468,804

(22) Filed: Mar. 24, 2017

(65) Prior Publication Data
US 2017/0285330 A1    Oct. 5, 2017

(30) Foreign Application Priority Data

Mar. 29, 2016 (JP) ................................. 2016-065206

(51) Int. Cl.
G02B 26/08        (2006.01)
G03B 21/00        (2006.01)

(52) U.S. Cl.
CPC ....... *G02B 26/0833* (2013.01); *G03B 21/008* (2013.01)

(58) Field of Classification Search
CPC . H01L 31/0203; H01L 23/04; H01L 23/3121; H01L 23/3135; H01L 23/467; H01L 23/49822; H01L 23/49827; H01L 23/49838; H01L 24/49; H01L 2924/14; H01L 2924/1461; H01L 2224/16145; H01L 2924/01079; H01L 23/36; G02B 26/0833; G02B 26/0816; G02B 7/1821
USPC ....................................... 359/223.1, 290–297
See application file for complete search history.

(56) References Cited

U.S. PATENT DOCUMENTS 7,898,724 B2     3/2011  Liu et al.
2008/0290489 A1* 11/2008  Cheng .................. B81B 7/0067
                                                257/680

FOREIGN PATENT DOCUMENTS

JP    2006-071879 A    3/2006
JP    2014-126731 A    7/2014

* cited by examiner

*Primary Examiner* — Euncha Cherry
(74) *Attorney, Agent, or Firm* — Oliff PLC

(57) ABSTRACT

An electro-optic device includes an interconnection board provided with an internal terminal, and a chip mounted on the interconnection board, and the chip is provided with a mirror, a drive element, and a chip-side terminal electrically connected to the drive element. The interconnection board includes a first surface on which an internal terminal is disposed, a second surface located on an opposite side to the first surface, a third surface connecting the first surface and the second surface to each other, and a fourth surface located on an opposite side to the third surface. The interconnection board is provided with a metal member exposed on the first surface and the second surface, and through holes (a first through hole and a second through hole) extending from the third surface to the fourth surface and having contact with the metal member.

8 Claims, 9 Drawing Sheets

ELECTRO-OPTIC DEVICE, ELETRO-OPTIC UNIT, AND ELECTRONIC APPARATUS

The entire disclosure of Japanese Patent Application No. 2016-065206, filed Mar. 29, 2016 is expressly incorporated by reference herein.

BACKGROUND

1. Technical Field

The present invention relates to an electro-optic device equipped with a mirror, an electro-optic unit, and an electronic device.

2. Related Art

As an electronic apparatus, there has been known, for example, a projection-type display device, which modulates the light emitted from a light source using a plurality of mirrors (micro mirrors) of an electro-optic device called a digital mirror device (DMD), and then projects the modulated light in an enlarged manner using a projection optical system. Such an electro-optic device has a chip provided with mirrors and drive elements for driving the mirrors, and an interconnection board on which the chip is mounted, and when the electro-optic device operates, the chip itself generates heat. Further, in the case of disposing a light-transmitting cover for covering the mirrors in a planar view, and a spacer located between the cover and the chip in the electro-optic device, since the light from the light source and the light reflected by the mirrors are transmitted through the cover, the cover generates heat, and as a result, the temperature of the chip rises. Such rise in temperature of the chip causes a false operation and a decrease in life of the electro-optic device, and is therefore undesirable.

Therefore, there has been proposed a structure improved in heat radiation performance by adopting a configuration in which the side surface of the spacer is covered with sealing resin, and the surface of the sealing resin has contact with the light transmissive cover at a position higher than the position at which the sealing resin and the spacer have contact with each other (see U.S. Pat. No. 7,898,724 (Document 1)).

However, even if the heat-transfer efficiency from the cover and so on to the sealing resin is improved with the configuration described in Document 1, the thermal conductivity of the sealing resin itself is low, and therefore, there is a problem that the rise in temperature of the chip cannot sufficiently be suppressed.

SUMMARY

An advantage of some aspects of the invention is to provide an electro-optic device, an electro-optic unit, and an electronic apparatus each capable of releasing the heat of the chip provided with the mirrors.

An electro-optic device according to an aspect of the invention includes an interconnection board provided with a first surface on which a first terminal is disposed, a second surface located on an opposite side to the first surface, a third surface connected to the second surface, and a fourth surface located on an opposite side to the third surface, a chip mounted on the first surface, and provided with a mirror, a drive element adapted to drive the mirror, and a second terminal electrically connected to the drive element, and a conductive member adapted to connect the first terminal and the second terminal to each other, and the interconnection board is provided with a metal member disposed between the first surface and the second surface, and exposed on the first surface and the second surface, and a first through hole extending from the third surface to the fourth surface, and having contact with the metal member.

According to this aspect of the invention, even if the temperature of the chip rises, the heat of the chip can be released to the metal member disposed in the interconnection board. Further, since the interconnection board is provided with the through hole extending so as to have contact with the metal member, the heat of the metal member can be released with the air flowing through the first through hole. Therefore, since the heat of the chip can efficiently be released, the rise in temperature of the chip can be suppressed. Therefore, it is possible to prevent the deterioration of the reliability of the electro-optic device.

In the aspect of the invention, it is preferable that the interconnection board is provided with a second through hole extending from the third surface to the fourth surface, and having contact with the metal member from an opposite side to a side from which the first through hole has contact with the metal member. According to such a configuration, the heat of the metal member can be released by the air flowing through the first through hole and the second through hole. Therefore, since the rise in temperature of the chip can be suppressed, the deterioration of the reliability of the electro-optic device can be prevented.

In the aspect of the invention with this configuration, it is preferable that the chip is located so as to overlap the metal member. According to such a configuration, it is possible to efficiently release the heat of the chip to the metal member.

In the aspect of the invention, it is preferable that the chip has contact with the metal member directly or via an adhesive layer. According to such a configuration, it is possible to efficiently release the heat of the chip to the metal member.

In the aspect of the invention with this configuration, it is preferable that the interconnection board includes a third terminal disposed on the second surface, and an interconnection part adapted to connect the first terminal and the third terminal to each other between the first surface and the second surface.

In this case, it is preferable that the plurality of first terminals and the plurality of third terminals are each arranged from the third surface toward the fourth surface. According to such a configuration, even if the interconnection parts are disposed between the first surface and the second surface of the interconnection board, it is possible to make the first through hole extend from the third surface to the fourth surface.

In an electro-optic unit having the electro-optic device to which the invention is applied, it is preferable to include a blower adapted to feed air toward the third surface. According to such a configuration, since the heat of the metal member can efficiently be released using the air passing through the first through hole, it is possible to prevent the deterioration of the reliability of the electro-optic device and so on.

The electro-optic device to which the invention is applied can be used for a variety of electronic apparatuses, and in this case, the electronic apparatus is provided with a light source section to irradiate the mirror with the source light. Further, in the case of configuring a projection-type display device as the electronic apparatus, the electronic apparatus is further provided with a projection optical system for projecting the light modulated by the mirror.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
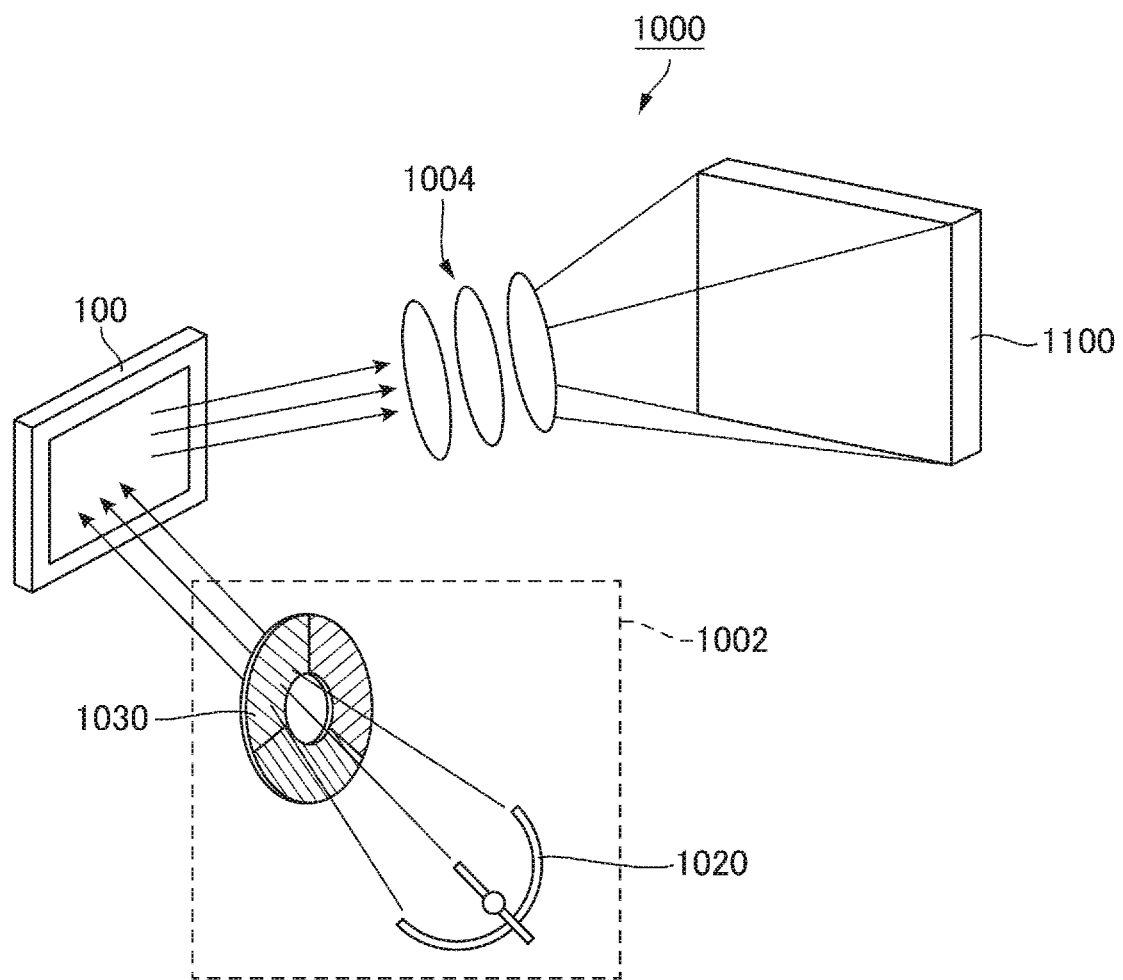
FIG. 1 is an explanatory diagram schematically showing an example of an optical system provided to a projection-type display device to which the invention is applied.

An embodiment of the invention will be described with reference to the accompanying drawings. It should be noted that in the following description, a projection-type display device will be explained as an electronic apparatus to which the invention is applied. Further, in the drawings referred to in the following description, the scale ratios of the layers and the members are made different from each other in order to provide the layers and the members with the sizes in a recognizable range on the drawings. Although the number of the mirrors and so on shown in the drawings is set so as to provide the size in the recognizable range on the drawings, it is also possible to provide a larger number of mirrors than the number of mirrors shown in the drawings.

Projection-Type Display Device as Electronic Apparatus

FIG. 1 is an explanatory diagram schematically showing an example of an optical system provided to a projection-type display device to which the invention is applied. The projection-type display device 1000 (the electronic apparatus) shown in FIG. 1 includes a light source section 1002, an electro-optic device 100 for modulating the source light emitted from the light source section 1002 in accordance with image information, and a projection optical system 1004 for projecting the light modulated by the electro-optic device 100 on a projection target 1100 such as a screen to form a projected image. The light source section 1002 is provided with a light source 1020 and a color filter 1030. The light source 1020 emits white light as the source light, the color filter 1030 emits the light of the respective colors due to the rotation, and the electro-optic device 100 modulates the incident light at a timing synchronized with the rotation of the color filter 1030. It should be noted that it is possible to use a phosphor substrate, which converts the light emitted from the light source 1020 into the light with the respective colors, instead of the color filter 1030. Further, it is also possible to provide the light source section 1002 and the electro-optic device 100 for the light with each of the colors.

Basic Configuration of Electro-Optic Device 100

Figure 2:
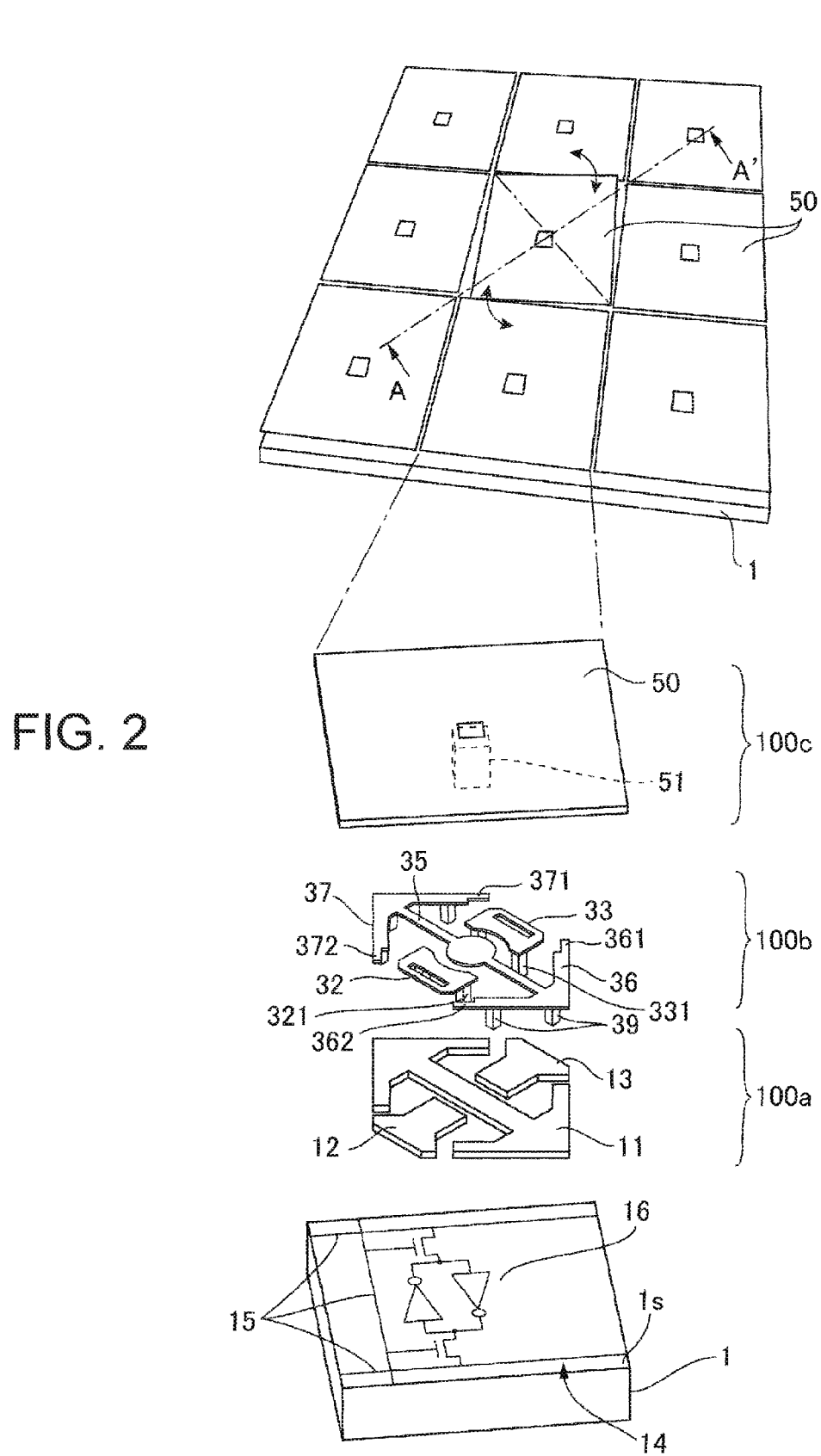
FIG. 2 is an explanatory diagram schematically showing an example of a basic configuration of an electro-optic device to which the invention is applied.
Figure 3:
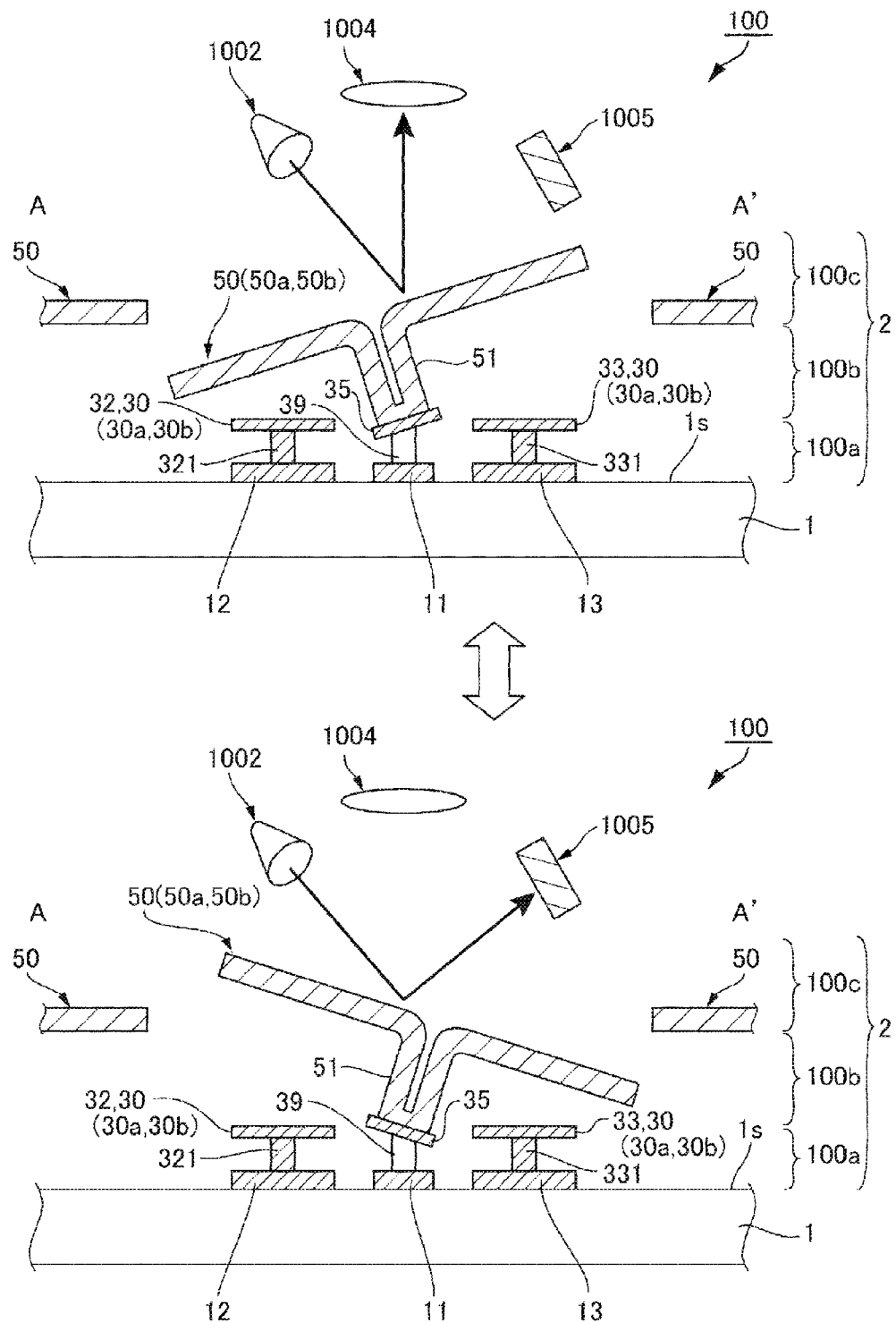
FIG. 3 is an explanatory diagram schematically showing a cross-sectional surface in the periphery of a mirror of the electro-optic device to which the invention is applied.

FIG. 2 is an explanatory diagram schematically showing an example of the basic configuration of the electro-optic device 100 to which the invention is applied, and FIG. 2 also shows a partially exploded condition. FIG. 3 is an explanatory diagram schematically showing a cross-sectional surface in the periphery of a mirror 50 of the electro-optic device 100 to which the invention is applied, and FIG. 3 shows the state in which the mirror 50 is tilted toward one side, and the state in which the mirror 50 is tilted toward the other side.

As shown in FIG. 2 and FIG. 3, the electro-optic device 100 is provided with a chip 2 having a plurality of mirrors 50 arranged in a matrix on one surface 1s of an element substrate 1, and in the chip 2, the mirrors 50 are separated from the element substrate 1. The element substrate 1 is, for example, a silicon substrate. The mirrors 50 are each, for example, a micromirror having a planar size of 10 through 30 μm in each side. The mirrors 50 are arranged in, for example, a matrix of 800×600 through 1028×1024, and each of the mirrors 50 corresponds to one pixel of an image.

The surface of each of the mirrors 50 is a reflecting surface formed of a reflecting metal film made of aluminum or the like. The chip 2 is provided with a first layer part 100a including substrate-side bias electrodes 11, substrate-side address electrodes 12, 13, and so on formed on the one surface 1s of the element substrate 1, a second layer part 100b including elevated address electrodes 32, 33 and hinges 35, and a third layer part 100c including the mirrors 50. In the first layer part 100a, the element substrate 1 is provided with an address designation circuit 14. The address designation circuit 14 is provided with memory cells for selectively controlling the operations of the respective mirrors 50, and interconnections 15 of word lines and bit lines, and has a circuit configuration similar to a RAM (random access memory) provided with a CMOS circuit 16.

The second layer part 100b includes the elevated address electrodes 32, 33, the hinges 35, and mirror posts 51. The elevated address electrodes 32, 33 are electrically connected to the substrate-side address electrodes 12, 13 via the electrode posts 321, 331, and at the same time supported by the substrate-side address electrodes 12, 13, respectively. Hinge arms 36, 37 extend respectively from both ends of the hinge 35. The hinge arms 36, 37 are electrically connected to the substrate-side bias electrode 11 via an arm post 39, and at the same time supported by the substrate-side bias electrode 11. The mirror 50 is electrically connected to the hinge 35 via the mirror post 51, and at the same time supported by the hinge 35. Therefore, the mirror 50 is electrically connected to the substrate-side bias electrode 11 via the mirror post 51, the hinge 35, the hinge arms 36, 37, and the arm post 39, and thus, the substrate-side bias electrode 11 applies a bias voltage to the mirror 50. It should be noted that the tips of the hinge arms 36, 37 are respectively provided with stoppers 361, 362 and stoppers 371, 372 for having contact with the mirror 50 to prevent the mirror 50 and the elevated address electrodes 32, 33 from having contact with each other when the mirror 50 is tilted.

The elevated address electrodes 32, 33 constitute a drive element 30 for generating an electrostatic force with the mirror 50 to drive the mirror 50 to tilt. Further, the substrate-side address electrodes 12, 13 are also configured to generate an electrostatic force with the mirror 50 to drive the mirror 50 to tilt in some cases, and in such cases, it results that the drive element 30 is constituted by the elevated address electrodes 32, 33 and the substrate-side address electrodes 12, 13. The hinge 35 is twisted when the drive voltage is applied to the elevated address electrodes 32, 33, and thus the mirror 50 is tilted so as to be drawn by the elevated address electrode 32 or the elevated address electrode 33, and exerts a force to restore the mirror 50 to the posture parallel to the element substrate 1 when the drive voltage applied to the elevated address electrodes 32, 33 stops to lose the attractive force to the mirror 50.

As shown in FIG. 3, in the electro-optic device 100, for example, when the mirror 50 tilts toward the elevated address electrode 32 on one side, there occurs an ON state in which the light emitted from the light source section 1002 is reflected by the mirror 50 toward the projection optical system 1004. In contrast, when the mirror 50 tilts toward the elevated address electrode 33 on the other side, there occurs an OFF state in which the light emitted from the light source section 1002 is reflected by the mirror 50 toward a light absorption device 1005, and in such an OFF state, no light is reflected toward the projection optical system 1004. Such drive is performed in each of the mirrors 50, and as a result, the light emitted from the light source section 1002 is modulated by the plurality of mirrors 50 into image light, and is then projected from the projection optical system 1004 to display an image.

It should be noted that in some cases, a plate-like yoke opposed to the substrate-side address electrodes 12, 13 is disposed integrally with the hinge 35, the mirror 50 is driven using an electrostatic force acting between the substrate-side address electrodes 12, 13 and the yoke in addition to the electrostatic force generated between the elevated address electrodes 32, 33 and the mirror 50.

Sealing Structure of Electro-Optic Device 100

Figure 4:
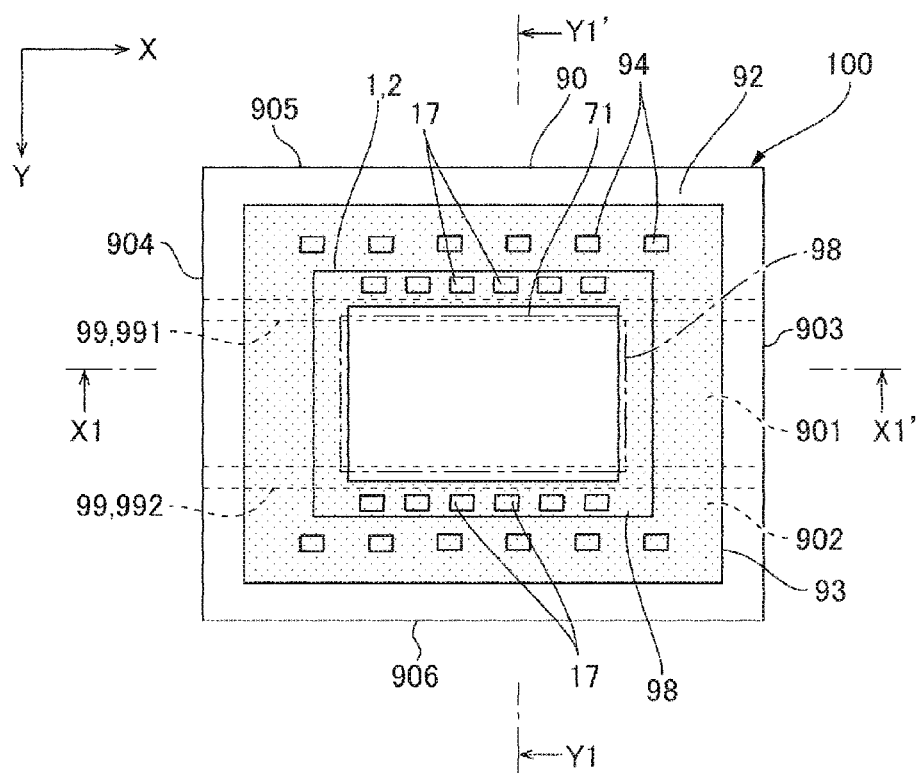
FIG. 4 is an explanatory diagram schematically showing a planar configuration of the electro-optic device to which the invention is applied.
Figure 5:
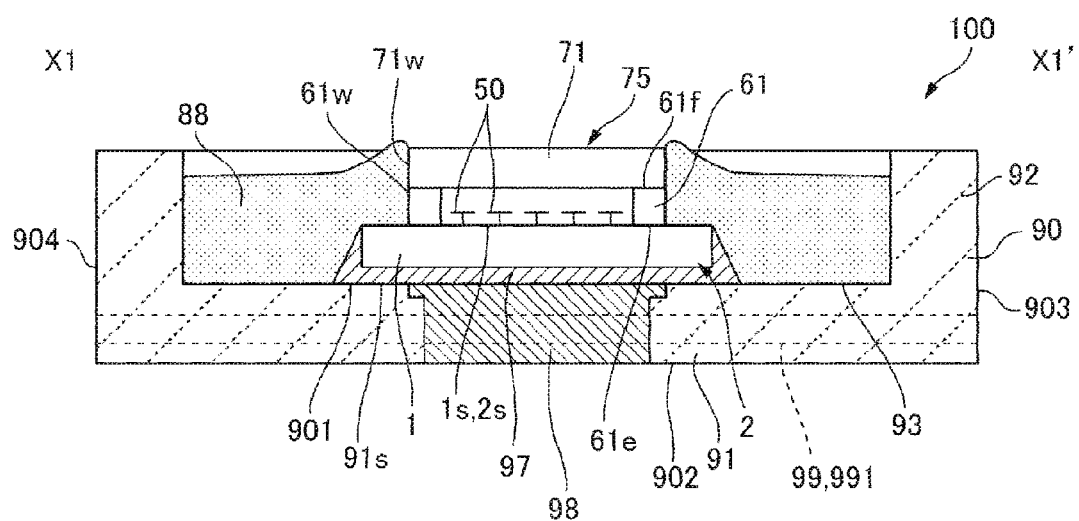
FIG. 5 is a cross-sectional view along the line X1-X1' schematically showing a cross-sectional surface of the whole of the electro-optic device to which the invention is applied.
Figure 6:
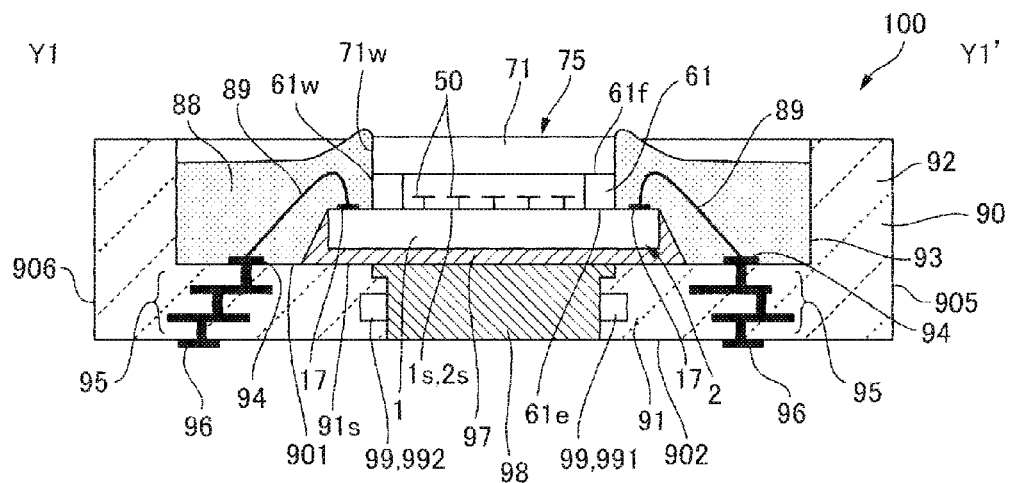
FIG. 6 is a cross-sectional view along the line Y1-Y1' schematically showing a cross-sectional surface of the whole of the electro-optic device to which the invention is applied.

FIG. 4 is an explanatory diagram schematically showing a planar configuration of the electro-optic device 100 to which the invention is applied. FIG. 5 is a cross-sectional view along the line X1-X1' schematically showing a cross-sectional surface of the whole of the electro-optic device 100 to which the invention is applied. FIG. 6 is a cross-sectional view along the line Y1-Y1' schematically showing a cross-sectional surface of the whole of the electro-optic device 100 to which the invention is applied.

As shown in FIG. 4, FIG. 5, and FIG. 6, in the electro-optic device 100 according to the present embodiment, the one surface 1s (one surface 2s of the chip 2) of the element substrate 1 (the chip 2) is sealed with a sealing member 75 formed of a spacer 61 shaped like a frame and a cover 71 shaped like a plate and having a light-transmitting property, then the element substrate 1 (the chip 2) is fixed to an interconnection board 90, and is then sealed with a sealing material 88. Therefore, the moisture is prevented from entering a part where the mirror 50 is disposed.

In the present embodiment, the interconnection board 90 is provided with a first surface 901 on which internal terminals 94 (first terminals) are disposed, a second surface 902 located on the opposite side to the first surface 901, a third surface 903 connected to the second surface 902, and a fourth surface 904 located on the opposite side to the third surface 903, and the third surface 903 and the fourth surface 904 are opposed to each other in the X direction. Further, the interconnection board 90 is provided with a fifth surface 905 and a sixth surface 906 opposed to each other in the Y direction. It should be noted that the fifth surface 905 and the sixth surface 906 are connected to the second surface 902. Further, the third surface 903 and the fourth surface 904 can also be surfaces extending along a direction from the first surface 901 toward the second surface 902.

In the interconnection board 90, a recessed part 93 having a bottom and surrounded by a side plate part 92 is formed in the first surface 901. A central area of a bottom plate part 91 located in the bottom part of the recessed part 93 forms a chip mounting part 91s to which the chip 2 is fixed with an adhesive layer 97, and the internal terminals 94 are disposed between the central area (the chip mounting part 91s) of the bottom plate part 91 and the side plate part 92.

The cover 71 covers the mirror 50 in a planar view, and the spacer 61 has contact with the one surface 2s of the chip 2 between the cover 71 and the chip 2. More specifically, an end part 61e of the spacer 61 located on the element substrate 1 side is bonded to the one surface 2s of the chip 2, and has contact with the one surface 2s of the chip 2. In the present embodiment, the one surface 2s of the chip 2 is formed of the one surface 1s of the element substrate 1. The cover 71 is bonded to an end part 61f, which is an end part of the spacer 61 located on the opposite side to the end part opposed to the element substrate 1, and is supported by the end part 61f. In this state, the cover 71 is opposed to the surface of each of the mirrors 50 at a position at a predetermined distance from the mirrors 50. Therefore, the light enters the mirror 50 through the cover 71, and then, the light reflected by the mirror 50 is emitted through the cover 71.

On the one surface 1s of the element substrate 1, a plurality of chip-side terminals 17 (second terminals) is formed in an end part (outer side of the spacer 61) not overlapping the mirrors 50. In the present embodiment, the chip-side terminals 17 are arranged in two lines so as to sandwich the mirrors 50 from the both sides in the Y direction. Some of the chip-side terminals 17 are electrically connected to the elevated address electrodes 32, 33 (the drive element 30) via the address designation circuit 14 and the substrate-side address electrodes 12, 13 described with reference to FIG. 2 and FIG. 3. Some of the rest of the chip-side terminals 17 are electrically connected to the mirrors 50 via the address designation circuit 14, the substrate-side bias electrodes 11, and the hinges 35 described with reference to FIG. 2 and FIG. 3. Some of the rest of the chip-side terminals 17 are electrically connected to the drive circuit and so on disposed in an anterior stage of the address designation circuit 14 described with reference to FIG. 2 and FIG. 3.

Here, the chip-side terminals 17 are in an open state on the opposite side to the element substrate 1, and are therefore electrically connected to the internal terminals 94 formed on the first surface 901 of the interconnection board 90 with conductive members 89 each formed of a wire for wire bonding or the like. In the interconnection board 90, external terminals 96 (third terminals) are disposed on the second surface 902, and the internal terminals 94 and the external terminals 96 are electrically connected to each other via interconnection parts 95 disposed between the first surface 901 and the second surface 902, respectively. The interconnection parts 95 are each a multilayer interconnection part provided with through holes and so on. Since the internal terminals 94 and the external terminals 96 are arranged along the X direction on the both sides in the Y direction of the mirrors 50, the interconnection parts 95 are also arranged along the X direction.

Further, in the inside of the side plate part 92 (the recessed part 93) of the interconnection board 90, there is disposed a sealing material 88 made of resin such as epoxy resin. The sealing material 88 covers the conductive members 89, bond parts between the conductive members 89 and the chip-side terminals 17, bond parts between the conductive members 89 and the internal terminals 94, the periphery of the chip 2, the periphery of the boundary (the adhesive layer) between the spacer 61 and the element substrate 1, and the periphery of the boundary (the adhesive layer) between the spacer 61 and the cover 71, and at the same time covers the entire side surface 61w of the spacer 61 and the entire side surface 71w of the cover 71.

Heat Dissipation Structure

In the electro-optic device 100 according to the present embodiment, the bottom plate part 91 of the interconnection board 90 is provided with a metal member 98 having a columnar shape disposed between the first surface 901 and the second surface 902, and the metal member 98 is exposed on the first surface 901 and the second surface 902. The metal member 98 is made of metal high in thermal conductivity such as aluminum or copper. Such a metal member 98 is formed using, for example, a process of forming the multilayer interconnections of the interconnection parts 95 of the interconnection board 90. In this case, the metal member 98 and the multilayer interconnections of the interconnection parts 95 are made of the same metal.

In the present embodiment, the metal member 98 is exposed in the chip mounting part 91s out of the first surface 901 of the interconnection board 90. Therefore, the chip 2 is disposed at a position overlapping the metal member 98. Further, the chip 2 has contact with the metal member 98 directly or via the adhesive layer 97. In the present embodiment, the chip 2 has contact with the metal member 98 via the adhesive layer 97.

The interconnection board 90 is provided with through holes 99 each extending in the X direction from the third surface 903 to the fourth surface 904, and having contact with the metal member 98, and the metal member 98 is partially exposed inside the through holes 99. In the present embodiment, the interconnection board 90 is provided with the two through holes 99 (the first through hole 991 and the second through hole 992) formed on both sides of the metal member 98. Among the two through holes 99, the first through hole 991 linearly extends in the X direction from the third surface 903 to the fourth surface 904 between the metal member 98 and the fifth surface 905, and has contact with the metal member 98. The second through hole 992 linearly extends in the X direction from the third surface 903 to the fourth surface 904 between the metal member 98 and the sixth surface 906, and has contact with the metal member 98 on the opposite side to the first through hole 991.

In the present embodiment, the size of the electro-optic device 100 in the Y direction, in which the chip-side terminals 17 are opposed to each other across the cover 71, is smaller than the size of the electro-optic device 100 in the X direction, in which the chip-side terminals 17 are arranged, and in accordance with such a configuration, the through holes 99 extend in the X direction.

Configuration of Electro-Optic Unit 180

Figure 7:
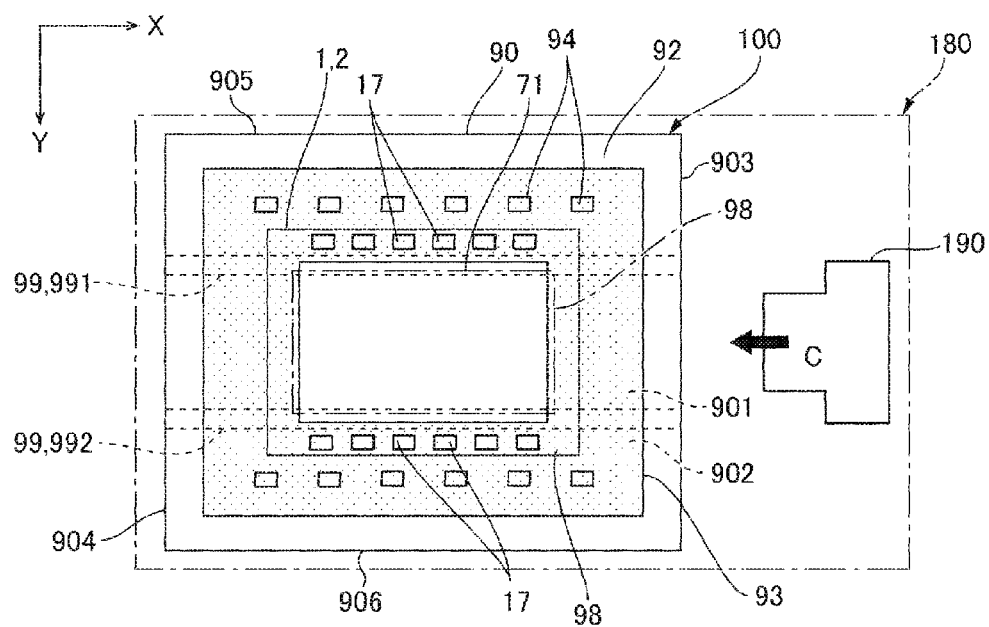
FIG. 7 is an explanatory diagram showing a planar configuration of an electro-optic unit to which the invention is applied.
Figure 8:
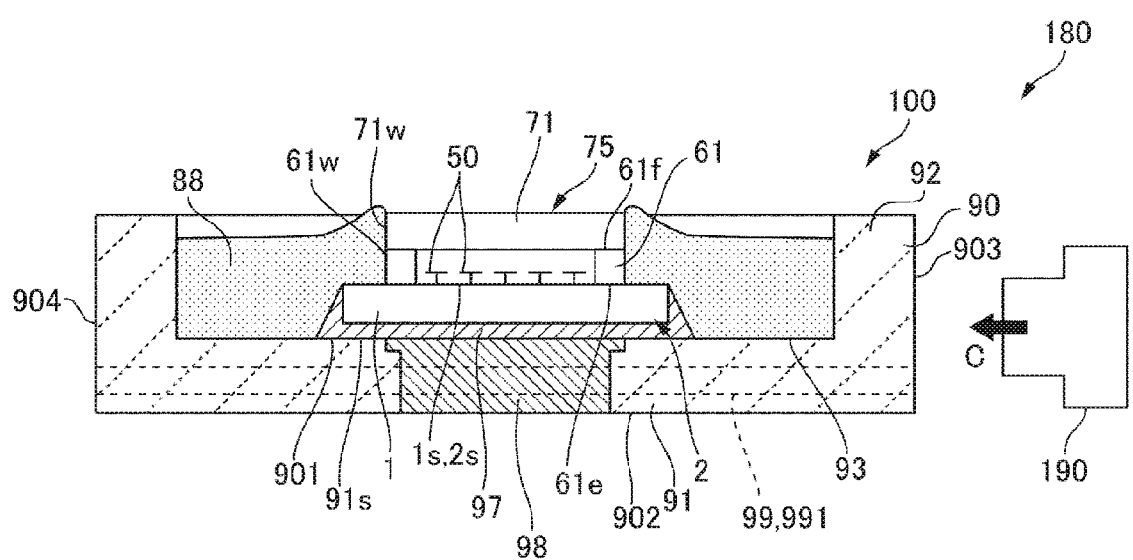
FIG. 8 is an explanatory diagram showing a cross-sectional surface of the electro-optic unit to which the invention is applied.

FIG. 7 is an explanatory diagram showing a planar configuration of an electro-optic unit 180 to which the invention is applied. FIG. 8 is an explanatory diagram showing a cross-sectional surface of the electro-optic unit 180 to which the invention is applied.

When using the electro-optic device 100 described with reference to FIG. 2 through FIG. 6 for the projection-type display device 1000 shown in FIG. 1 or the like, in the present embodiment, the electro-optic unit 180 is constituted by the electro-optic device 100, and a blower 190 for supplying air to the electro-optic device 100 as shown in FIG. 7 and FIG. 8. The blower 190 is disposed so as to be opposed to the third surface 903 of the interconnection board 90, and the blower 190 supplies an airflow toward the third surface 903 of the interconnection board 90 as indicated by the arrow C. Therefore, a part of the airflow supplied from the blower 190 is blown out from the second surface 902 side through the through holes 99 of the interconnection board 90. On this occasion, the airflow receives the heat of the chip 2 inside the through holes 99 via the metal member 98, and then blown out from the second surface 902 side.

Method of Manufacturing Electro-Optic Device 100

Figure 9:
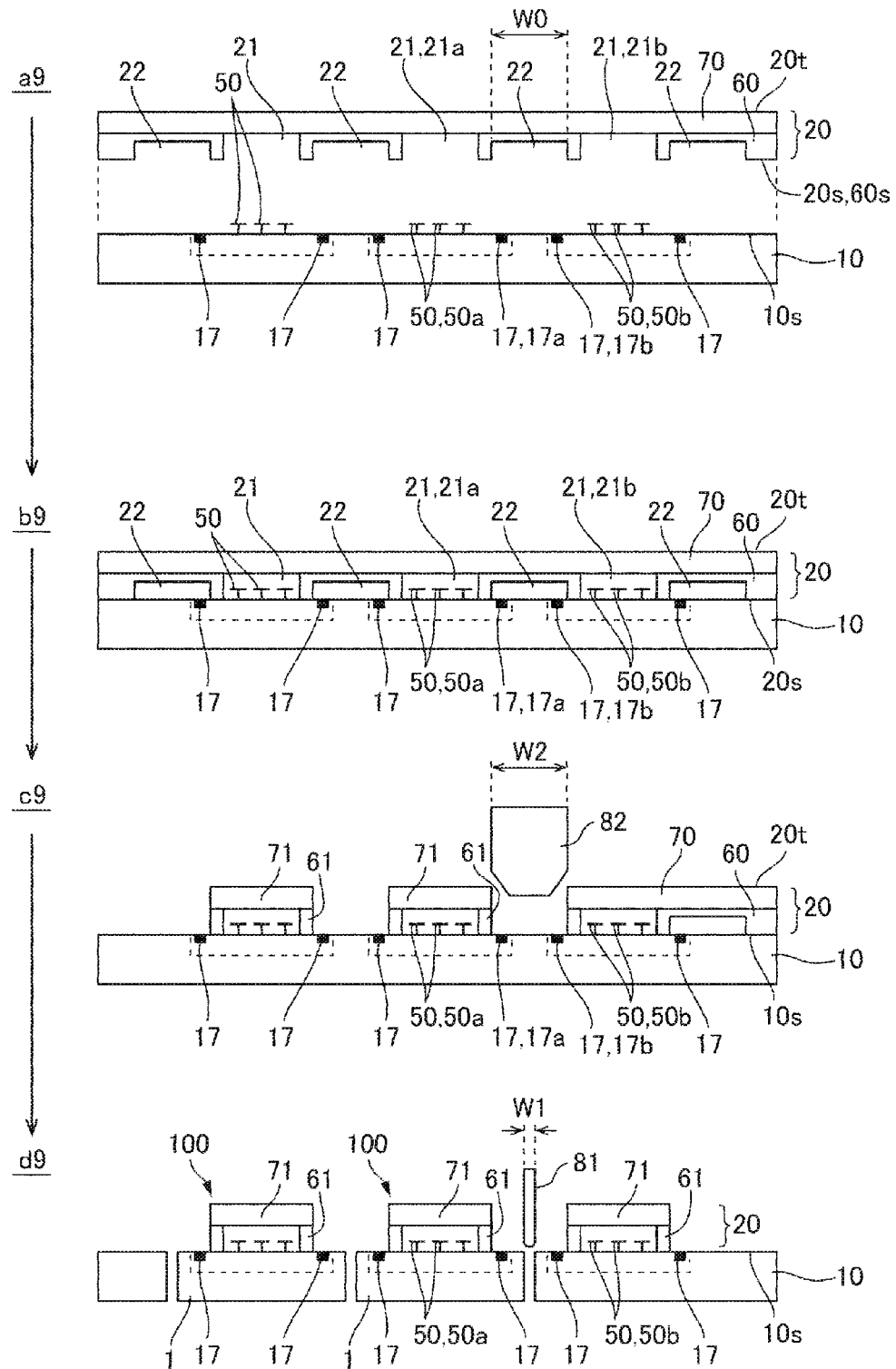
FIG. 9 is a process cross-sectional view showing a method of manufacturing the electro-optic device to which the invention is applied.
Figure 10:
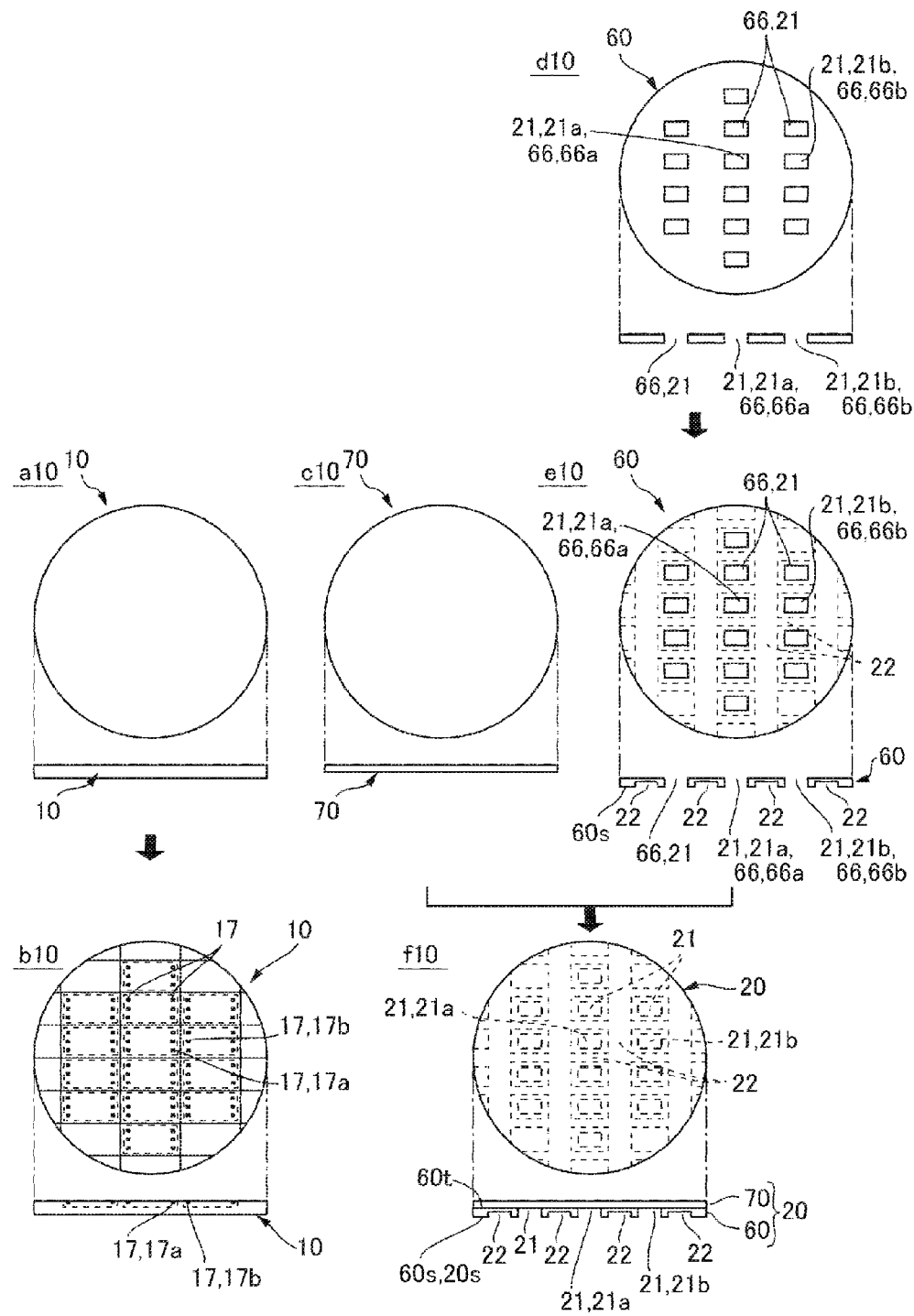
FIG. 10 is a process chart showing a method of manufacturing a second wafer and so on used for the manufacture of the electro-optic device to which the invention is applied.
Figure 11:
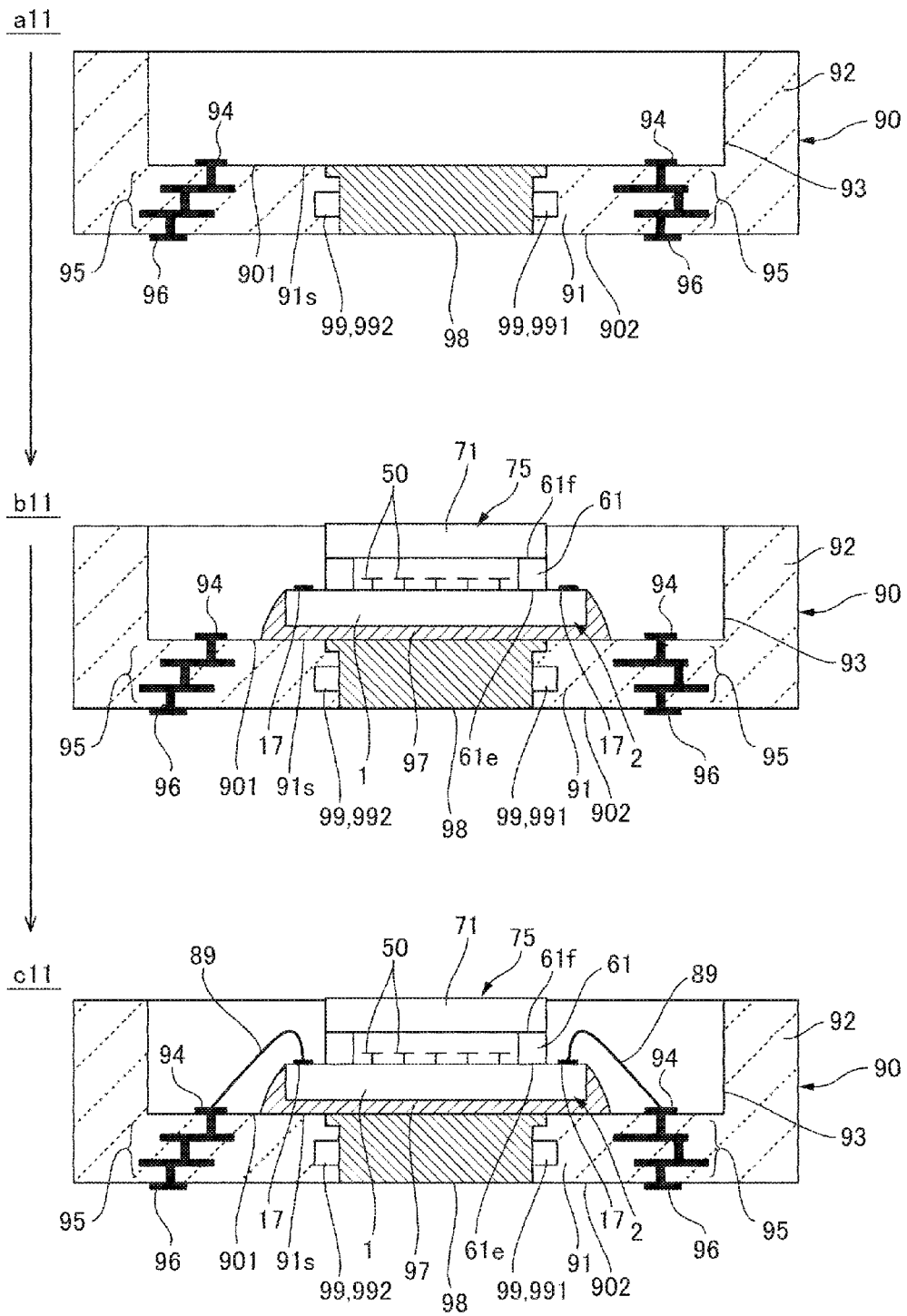
FIG. 11 is a process cross-sectional view showing a process of sealing a substrate with a board and sealing resin in a manufacturing process of the electro-optic device to which the invention is applied.

A method of manufacturing the electro-optic device 100 to which the invention is applied will be described with reference to FIG. 9, FIG. 10, and FIG. 11. FIG. 9 is a process cross-sectional view showing the method of manufacturing the electro-optic device 100 to which the invention is applied. FIG. 10 is a process chart showing a manufacturing method of a second wafer 20 and so on used in the manufacture of the electro-optic device 100 to which the invention is applied, and FIG. 10 shows a plan view of the wafer in each process, and at the same time shows a cross-sectional view below the plan view. FIG. 11 is a process cross-sectional view showing a process of sealing the element substrate 1 with the interconnection board 90 and the sealing material 88 in the manufacturing process of the electro-optic device 100 to which the invention is applied. In FIG. 10, illustration of the mirrors 50 and so on is omitted, and in FIG. 9, it is assumed that the number of mirrors 50 is decreased compared to FIG. 4, and three mirrors 50 are provided to one element substrate 1.

In the present embodiment, a plurality of element substrates 1 and so on is obtained from a wafer with multi-piece processing. Therefore, in the following description, among the plurality of element substrates 1 obtained with the multi-piece processing, the mirrors 50 and the chip-side terminals 17 formed in an area where one substrate is obtained are described attaching "a" to the back of each of the reference symbols like "first mirrors 50a" and "first chip-side terminals 17a." Further, among the plurality of element substrates 1, the mirrors 50 and the chip-side terminals 17, which are formed in an area adjacent to the area where the first mirrors 50a and the first chip-side terminals 17a are formed, are described attaching "b" to the back of each of the reference symbols like "second mirrors 50b" and "second chip-side terminals 17b." It should be noted that in the case in which there is no need to specify which element substrate 1 is mentioned, the description will be presented without attaching "a" or "b" described above.

In order to manufacture the electro-optic device 100 according to the present embodiment, a first wafer 10, which is large in size, and with which the multi-piece processing of the element substrates 1 can be realized, is prepared in the process a9 shown in FIG. 9 and the processes a10, b10 (first wafer preparatory process) shown in FIG. 10. On one surface 10s of the first wafer 10, the mirrors 50 and the chip-side terminals 17 are formed in each of the areas which are divided to form the element substrates 1.

Therefore, on the one surface 10s of the first wafer 10, the first mirrors 50a are formed, and at the same time, the first chip-side terminals 17a electrically connected to the first drive element 30a (see FIG. 2 and FIG. 3) for driving the first mirrors 50a are formed at positions adjacent to the first mirrors 50a in a planar view. Further, on the one surface 10s of the first wafer 10, there are formed the second mirrors 50b on the opposite side to the first mirrors 50a with respect to the first chip-side terminals 17a, and at the same time, there are formed the second chip-side terminals 17b electrically connected to the second drive element 30b (see FIG. 2 and FIG. 3) for driving the second mirrors 50b between the first chip-side terminals 17a and the second mirrors 50b.

Further, in the process a9 (the second wafer forming process) shown in FIG. 9, there is prepared a second wafer 20, which is large in size, and with which the multi-piece processing of the spacers 61 and the covers 71 can be realized. On one surface 20s of the second wafer 20, a recessed part 21 the bottom of which has a light-transmitting property is formed in each of the areas which are divided to form the spacers 61 and the covers 71, and at the same time, there are formed grooves 22 each having a bottom and extending in two directions perpendicular to each other to surround each of the recessed parts 21. One of the recessed parts 21 corresponds to the first recessed part 21a, and the recessed part 21 adjacent to the first recessed part 21a corresponds to the second recessed part 21b. Therefore, on the one surface 20s of the second wafer 20, there are formed the first recessed part 21a the bottom part of which has a light-transmitting property, the second recessed part 21b the bottom part of which has a light-transmitting property, and the grooves 22 each having a bottom and extending along the space between the first recessed part 21a and the second recessed part 21b.

When forming such a second wafer 20, in the second wafer forming process, for example, the processes c10 through f10 shown in FIG. 10 are performed. Firstly, in the process c10, there is prepared a light-transmitting wafer 70 (a fourth wafer), with which the multi-piece processing of the covers 71 can be realized. Further, in the process d10, a wafer-for-spacers 60 (a third wafer) with which the multi-piece processing of the spacers 61 can be realized is prepared, and then, in the first process, holes 66 each formed of a penetrating part for forming the recessed part 21 are formed in the wafer-for-spacers 60 using a process such as etching. One of the holes 66 corresponds to a first hole 66a for forming the first recessed part 21a, and the hole 66 adjacent to the first hole 66a corresponds to a second hole 66b for forming the second recessed part 21b. Then, in the process e10, the grooves 22 each having a bottom and extending in the two directions perpendicular to each other to surround each of the recessed parts 21 are formed using a process such as half etching. It should be noted that although in the first process, the holes 66 are formed and then the grooves 22 are formed, it is also possible to form the grooves 22 and then form the holes 66.

Then, in the second process, as shown in the process f10, the light-transmitting wafer 70 is stacked on and bonded to a surface 60t of the wafer-for-spacers 60 located on the opposite side to a surface 60s on which the grooves 22 open. As a result, a second wafer 20 having the wafer-for-spacers 60 and the light-transmitting wafer 70 stacked on one another is formed, and in such a second wafer 20, the surface 60s of the wafer-for-spacers 60 forms the one surface 20s of the second wafer 20, and the surface of the light-transmitting wafer 70 located on the opposite side to the wafer-for-spacers 60 forms the other surface 20t of the second wafer 20. Further, one opening ends of the holes 66 (the first hole 66a and the second hole 66b) are blocked by the light-transmitting wafer 70 to form the recessed parts 21 (the first recessed part 21a and the second recessed part 21b) the bottom parts of which have a light-transmitting property.

Then, in the bonding process, in the process b9 shown in FIG. 9, the one surface 10s of the first wafer 10 and the one surface 20s of the second wafer 20 are bonded to each other so that the recessed parts 21 overlap the mirrors 50 in a planar view (e.g., the planar view when viewing the first wafer 10 from the one surface 10s side), and the grooves 22 overlap the chip-side terminals 17. As a result, the first recessed part 21a overlaps the first mirrors 50a in the planar view, the second recessed part 21b overlaps the second mirrors 50b in the planar view, the common groove 22 overlaps the first chip-side terminals 17a, the second chip-side terminals 17b, and an area sandwiched by the first chip-side terminals 17a and the second chip-side terminals 17b in the planar view. In this state, the part sandwiched by the first recessed part 21a and the groove 22 in the second wafer 20 is bonded to the area between the first mirror 50a and the first chip-side terminals 17a, and the part sandwiched by the second recessed part 21b and the groove 22 in the second wafer 20 is bonded to the area between the second mirror 50b and the second chip-side terminals 17b. Therefore, the first chip-side terminals 17a and the second chip-side terminals 17b are not bonded to the second wafer 20.

Then, in the process c9 (a second wafer dicing process) shown in FIG. 9, by making a dicing blade-for-second wafer 82 (a first dicing blade) approach from the other surface 20t of the second wafer 20, the second wafer 20 is diced along the grooves 22. As a result, the second wafer 20 is divided, the cover 71 is constituted by a plate part obtained by dividing the light-transmitting wafer 70 out of the second wafer 20, and the spacer 61 is constituted by a frame part obtained by dividing the wafer-for-spacers 60. In the present embodiment, the thickness W2 of the dicing blade-for-second wafer 82 is equivalent to the width W0 of the groove 22.

Then, in the process d9 (a first wafer dicing process) shown in FIG. 9, the first wafer 10 is diced along the area (the area sandwiched by the first chip-side terminals 17a and the second chip-side terminals 17b) into which the first wafer 10 is divided to form the element substrate 1 using a dicing blade-for-first wafer 81 (a second dicing blade). As a result, the first wafer 10 is diced in the area between the first chip-side terminals 17a and the second chip-side terminals 17b. In the present embodiment, the thickness W1 of the dicing blade-for-first wafer 81 is thinner than the thickness W2 of the dicing blade-for-second wafer 82. Therefore, in the first dicing process, the dicing blade-for-first wafer 81 is made to approach the cut place (an area between the covers 71 adjacent to each other, and an area between the spacers 61 adjacent to each other) of the second wafer 20 from the side of the second wafer 20 with respect to the first wafer 10 to dice the first wafer 10.

As a result, there is manufactured a plurality of electro-optic devices 100 each having the element substrate 1, which is provided with the mirrors 50 formed on the one surface 1s, and the one surface 1s of which is sealed with the spacer 61 and the cover 71. In order to further seal such an electro-optic device 100 with the interconnection board 90 and the sealing material 88 as shown in FIG. 4, the process shown in FIG. 11 is performed.

Firstly, in the process all shown in FIG. 11, the interconnection board 90 described with reference to FIG. 4, FIG. 5, and FIG. 6 is prepared, and then in the process b11 shown in FIG. 11, the chip 2 is fixed to the interconnection board 90 with the adhesive layer 97. Then, in the process c11 shown in FIG. 11, the chip-side terminals 17 on the element substrate 1 and the internal terminals 94 on the interconnection board 90 are electrically connected to each other with the conductive members 89 for wire bonding. Then, as described with reference to FIG. 5 and FIG. 6, the sealing material 88 is poured inside the side plate part 92 of the interconnection board 90, and then the sealing material 88 is made to cure to seal the element substrate 1 with the sealing material 88. As a result, it is possible to obtain the electro-optic device 100 having the element substrate 1 sealed with the spacer 61, the cover 71, the interconnection board 90, and the sealing material 88.

Major Advantages of Present Embodiment

As described hereinabove, in the electro-optic device 100 according to the present embodiment, the interconnection board 90 is provided with the metal member 98 exposed on the first surface 901 and the second surface 902, and the through holes 99 (the first through hole 991 and the second through hole 992) extending from the third surface 903 to the fourth surface 904 and having contact with the metal member 98. Therefore, even if the temperature of the chip 2 rises, the heat of the chip 2 can efficiently be released to the metal member 98. Further, the heat of the metal member 98 can be released by the air flowing through the through holes 99 (the first through hole 991 and the second through hole 992). Further, the through holes 99 are disposed in two lines on the both sides of the metal member 98 as the first through hole 991 and the second through hole 992, and can therefore more efficiently release the heat of the metal member 98 with the air flowing through the through holes 99. Therefore, since the rise in temperature of the chip 2 can be suppressed, deterioration of the reliability of the electro-optic device 100 can be prevented.

Further, the chip 2 is disposed at the position overlapping the metal member 98. Further, the chip 2 has contact with the metal member 98 via the adhesive layer 97, and only the adhesive layer 97 small in thickness intervenes between the chip 2 and the metal member 98. Therefore, it is possible to efficiently release the heat of the chip 2 to the metal member 98.

Further, the interconnection board 90 is provided with the interconnection parts 95, which connect the internal terminals 94 (the first terminals) disposed on the first surface 901 and the external terminals 96 (the third terminals) disposed on the second surface 902 to each other, disposed between the first surface 901 and the second surface 902. Even in this case, since the plurality of internal terminals 94 and the plurality of external terminals 96 are arranged in the X direction from the side of the third surface 903 toward the side of the fourth surface 904, even if the interconnection parts 95 are disposed between the first surface 901 and the second surface 902 of the interconnection board 90, it is easy to make the through holes 99 (the first through hole 991 and the second through hole 992) extending in the X direction extend from the third surface 903 to the fourth surface 904.

Another Embodiment

Although in the embodiment described above, there is adopted the configuration in which the chip 2 has contact with the metal member 98 via the adhesive layer 97, it is also possible to adopt a configuration in which the chip 2 has direct contact with the metal member 98.

What is claimed is:

1. An electro-optic device comprising:
an interconnection board provided with a first surface on which a first terminal is disposed, a second surface located on an opposite side to the first surface, a third surface connected to the second surface, and a fourth surface located on an opposite side to the third surface;
a chip mounted on the first surface, and provided with a mirror, a drive element adapted to drive the mirror, and a second terminal electrically connected to the drive element; and
a conductive member adapted to connect the first terminal and the second terminal to each other,
wherein the interconnection board is provided with a metal member disposed between the first surface and the second surface, and exposed on the first surface and the second surface, and a first through hole extending from the third surface to the fourth surface, and having contact with the metal member.

2. The electro-optic device according to claim 1, wherein the interconnection board is provided with a second through hole extending from the third surface to the fourth surface, and having contact with the metal member from an opposite side to a side from which the first through hole has contact with the metal member.

3. The electro-optic device according to claim 1, wherein the chip is located so as to overlap the metal member.

4. The electro-optic device according to claim 3, wherein the chip has contact with the metal member directly or via an adhesive layer.

5. The electro-optic device according to claim 1, wherein the interconnection board includes a third terminal disposed on the second surface, and an interconnection part adapted to connect the first terminal and the third terminal to each other between the first surface and the second surface.

6. The electro-optic device according to claim 5, wherein the plurality of first terminals and the plurality of third terminals are each arranged from the third surface toward the fourth surface.

7. An electro-optic unit comprising:
the electro-optic device according to claim 1; and
a blower adapted to feed air toward the third surface.

8. An electronic apparatus comprising:
the electro-optic device according to claim 1; and
a light source section adapted to irradiate the mirror with source light.

* * * * *